(12) United States Patent
Jiang

(10) Patent No.: US 10,939,568 B2
(45) Date of Patent: Mar. 2, 2021

(54) HOUSING ASSEMBLY

(71) Applicant: Chicony Electronics Co., Ltd., New Taipei (TW)

(72) Inventor: Yi-Sing Jiang, New Taipei (TW)

(73) Assignee: Chicony Electronics Co., Ltd., New Taipei (TW)

( * ) Notice: Subject to any disclaimer, the term of this patent is extended or adjusted under 35 U.S.C. 154(b) by 0 days.

(21) Appl. No.: 16/687,632

(22) Filed: Nov. 18, 2019

(65) Prior Publication Data
US 2021/0021737 A1 Jan. 21, 2021

(30) Foreign Application Priority Data
Jul. 17, 2019 (TW) .................................. 108125308

(51) Int. Cl.
| | |
|---|---|
| *H05K 5/02* | (2006.01) |
| *G08B 13/196* | (2006.01) |
| *H04N 5/225* | (2006.01) |
| *G06F 1/16* | (2006.01) |
| *H05K 5/00* | (2006.01) |

(52) U.S. Cl.
CPC ............ *H05K 5/0208* (2013.01); *G06F 1/16* (2013.01); *G08B 13/19619* (2013.01); *H04N 5/2252* (2013.01); *H05K 5/0004* (2013.01); *H05K 5/0221* (2013.01)

(58) Field of Classification Search
CPC ........ G06F 1/16; G06F 1/1613; G06F 1/1633; G06F 1/1656; H05K 5/0004; H05K 5/0008; H05K 5/0013; H05K 5/0204; H05K 5/0208; H05K 5/0217; H05K 5/0221
See application file for complete search history.

(56) References Cited

U.S. PATENT DOCUMENTS

| | | | | |
|---|---|---|---|---|
| 9,284,751 | B2* | 3/2016 | Rickman | E05B 65/0089 |
| 9,363,908 | B1* | 6/2016 | Wang | H05K 7/1487 |
| 9,614,307 | B2* | 4/2017 | Fan | H01R 12/7076 |
| 9,695,972 | B1* | 7/2017 | Jiang | H05K 5/0017 |
| 9,832,894 | B1* | 11/2017 | Lo | B25B 27/02 |
| 10,633,892 | B2* | 4/2020 | Yonemura | E05B 65/0067 |
| 2020/0245489 | A1* | 7/2020 | Boeckmann | G11B 33/128 |

FOREIGN PATENT DOCUMENTS

| | | |
|---|---|---|
| CN | 2735421 Y | 10/2005 |
| TW | I445481 B * | 7/2014 |

* cited by examiner

*Primary Examiner* — John Villecco
(74) *Attorney, Agent, or Firm* — CKC & Partners Co., LLC

(57) ABSTRACT
A housing assembly includes a main body, a button, a base, and a fixing member. The main body has an inner space and a through hole communicated with each other. The button includes a pressing portion. The pressing portion protrudes out of the main body from the through hole and is configured to be pressed to sink into the through hole. The base has a recess and an engaging hole communicated with each other. The recess is configured to accommodate the main body. The engaging hole is configured to be engaged with the pressing portion. The fixing member is coupled to the main body in the inner space and configured to block the pressing portion from sinking into the through hole and disengaging from the engaging hole.

19 Claims, 19 Drawing Sheets

HOUSING ASSEMBLY

CROSS-REFERENCE TO RELATED APPLICATION

This application claims priority to Taiwan Application Serial Number 108125308, filed Jul. 17, 2019, which is herein incorporated by reference.

BACKGROUND

Technical Field

The present disclosure relates to a housing assembly.

Description of Related Art

In order to facilitate quick disassembly and assembly, some conventional outdoor products (e.g., monitoring equipment or lamps) are generally divided into "product body" and "product support". The product support is fixed to an outdoor environment (e.g., a building wall or utility pole), and the release button is designed to secure or separate the product body and the product support. However, for outdoor products, as they are designed to be installed outdoors, it is of course possible to be stolen by interested parties, but the design of the release button cannot avoid theft. In addition, the release button itself also has a predetermined service life, so that after a number of presses, there is also the possibility of damage.

Accordingly, how to provide a housing assembly to solve the aforementioned problems becomes an important issue to be solved by those in the industry.

SUMMARY

An aspect of the disclosure is to provide a housing assembly which can effectively solve the aforementioned problems.

According to an embodiment of the disclosure, a housing assembly includes a main body, a button, a base, and a fixing member. The main body has an inner space and a through hole communicated with each other. The button includes a pressing portion. The pressing portion protrudes out of the main body from the through hole and is configured to be pressed to sink into the through hole. The base has a recess and an engaging hole communicated with each other. The recess is configured to accommodate the main body. The engaging hole is configured to be engaged with the pressing portion. The fixing member is coupled to the main body in the inner space and configured to block the pressing portion from sinking into the through hole and disengaging from the engaging hole.

In an embodiment of the disclosure, the main body includes a connecting portion located in the inner space. The connecting portion has a connecting hole. The fixing member is connected to the connecting hole. When the fixing member enters the connecting hole for a first depth and the pressing portion abuts against the fixing member, the pressing portion partially protrudes out of the main body from the through hole. When the fixing member enters the connecting hole for a second depth, the pressing portion sinks into the through hole.

In an embodiment of the disclosure, the pressing portion has a through passage substantially facing the fixing member.

In an embodiment of the disclosure, the main body has an inner surface. The button further includes a stopping portion. The stopping portion is connected to the pressing portion and configured to abut against the inner surface.

In an embodiment of the disclosure, the button further includes an elastic arm portion. The elastic arm portion includes a first connecting section and a second connecting section. The first connecting section is coupled to the main body in the inner space and has a connecting hole. The second connecting section is connected between the first connecting section and the pressing portion and has a passing hole. The fixing member slidably passes through the passing hole and passes into the connecting hole.

In an embodiment of the disclosure, the main body further has a screw hole located in the inner space. The fixing member is a screw and sequentially passes through the passing hole and the connecting hole to be screwed with the screw hole.

In an embodiment of the disclosure, the button further includes an elastic arm portion having a first hole. The housing assembly further includes a blocking plate. The blocking plate includes a stopping portion and an extending portion connected to each other. The stopping portion is configured to be inserted into the first hole. The extending portion passes through the first hole and has a second hole. The main body includes a connecting portion located in the inner space. The connecting portion has a connecting hole. The fixing member passes through the second hole and is connected to the connecting hole, so as to retain the blocking plate through the second hole.

In an embodiment of the disclosure, the stopping portion includes a first bending section and a second bending section. The first bending section is connected to the extending portion and bent relative to the extending portion. The second bending section is connected to the first bending section, bent relative to the first bending section, and configured to be inserted into the first hole.

In an embodiment of the disclosure, distances between the second bending section and the extending portion gradually reduce toward the pressing portion.

In an embodiment of the disclosure, the first hole has a first opening and a second opening. The first opening and the second opening are respectively away from and adjacent to the second hole. A width of the first opening is greater than a width of the second opening.

In an embodiment of the disclosure, the connecting hole is a screw hole. The fixing member is a screw and is screwed with the connecting hole.

In an embodiment of the disclosure, the fixing member is rotatably connected to the connecting hole with respect to a first axis and has a passing portion inserted into the second hole. The passing portion has a first width and a second width respectively with respect to a second axis and a third axis that are perpendicular to the first axis.

In an embodiment of the disclosure, the second hole extends away from the stopping portion substantially along a fourth axis.

In an embodiment of the disclosure, the second hole has a third width with respect to the fourth axis at a place adjacent to the stopping portion and a fourth width with respect to the fourth axis at a place away from the stopping portion. The first width is less than the third width and greater than the fourth width. The second width is less than the fourth width.

In an embodiment of the disclosure, the second axis and the third axis are substantially perpendicular to each other.

In an embodiment of the disclosure, the pressing portion has a through passage. The fixing member is slidably connected to the through passage.

Accordingly, the housing assembly of the present disclosure integrates the button and the fixing member into the main body and makes them cooperate to perform the function of anti-theft. Specifically, by installing the fixing member in the main body or adjusting the fixing member that has been installed in the main body, the button can be blocked by the fixing member and cannot be pressed, so that the main body cannot be disassembled relative to the base correspondingly; by removing the fixing member from the main body or adjusting the fixing member that has been installed in the main body, the button can detach from the fixing member and is allowed to be pressed, so that the main body is allowed to be disassembled relative to the base correspondingly. Since the button cannot be pressed when it is blocked by the fixing member, the damage probability of the button can be effectively reduced, thereby increasing the service life of the button.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
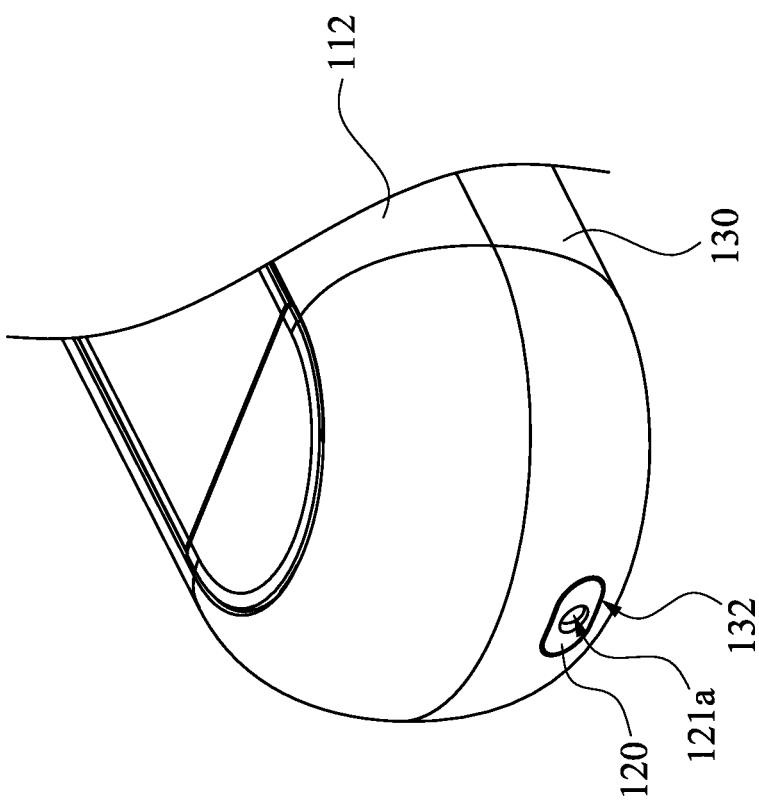
FIG. 1A is a partial perspective view of a housing assembly according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing exemplary embodiments, and thus may be embodied in many alternate forms and should not be construed as limited to only exemplary embodiments set forth herein. Therefore, it should be understood that there is no intent to limit exemplary embodiments to the particular forms disclosed, but on the contrary, exemplary embodiments are to cover all modifications, equivalents, and alternatives falling within the scope of the disclosure.

Figure 1B:
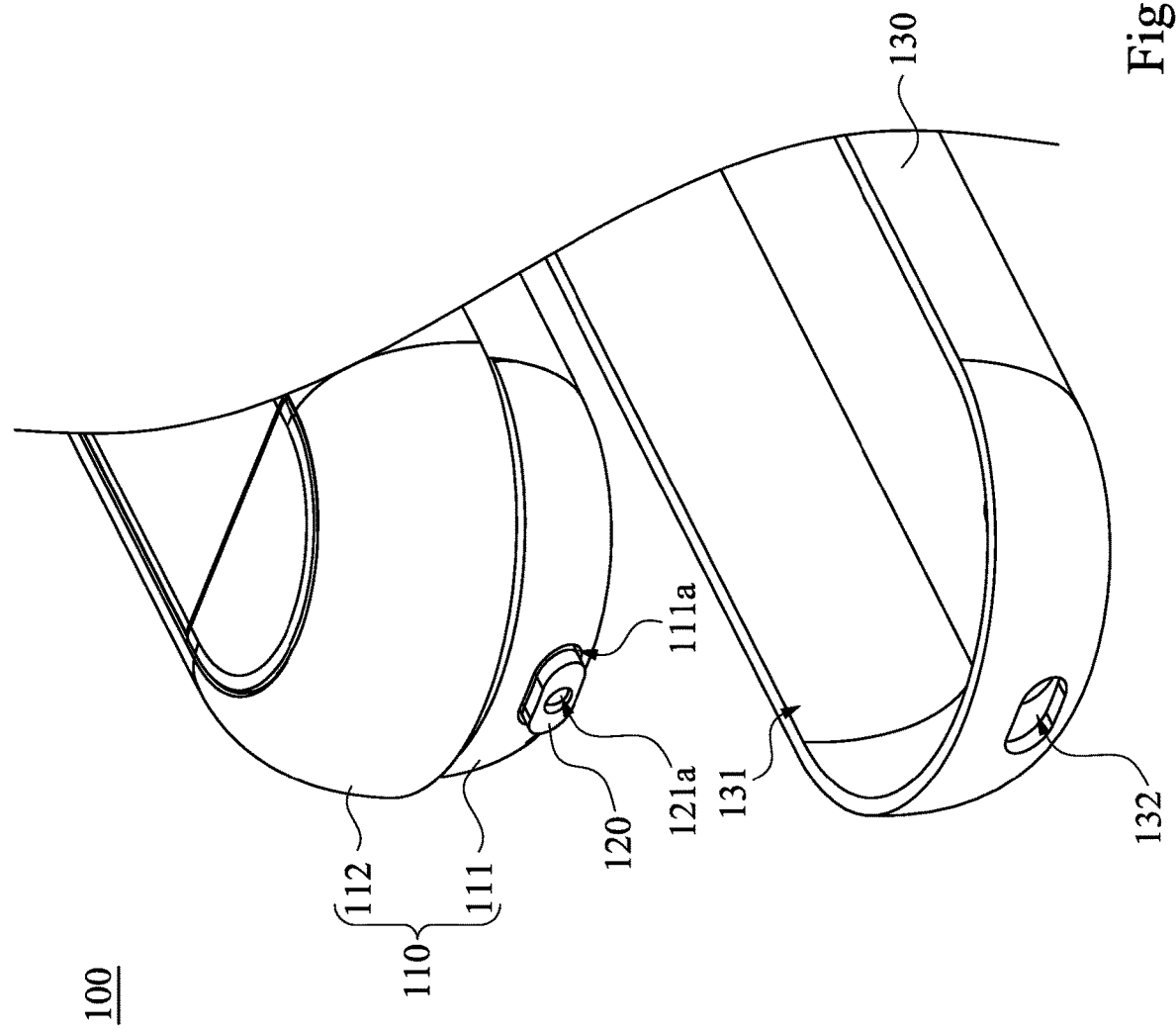
FIG. 1B is another partial perspective view of the housing assembly shown in FIG. 1A, in which a base is separated from a main body.

Reference is made to FIGS. 1A and 1B. FIG. 1A is a partial perspective view of a housing assembly 100 according to an embodiment of the disclosure. FIG. 1B is another partial perspective view of the housing assembly 100 shown in FIG. 1A, in which a base is separated from a main body. As shown in FIGS. 1A and 1B, the housing assembly 100 of the present embodiment is an outdoor product, such as monitoring equipment or a lamp, but the disclosure is not limited in this regard. That is, concepts of the housing assembly 100 of the disclosure can be used in any outdoor products. In the present embodiment, the housing assembly 100 includes a main body 110, a button 120, and a base 130. The main body 110 includes a supporting bracket 111 and a cover 112. The main body 110 is, for example, in the shape of a box, and the supporting bracket 111 and the cover 112 are assembled to each other. The main body 110 has an inner space S (referring to FIG. 2A) and a through hole 111a communicated with each other. The button 120 includes a pressing portion 121. The pressing portion 121 protrudes out of the main body 110 from the through hole 111a and is configured to be pressed to sink into the through hole 111a. The base 130 is configured to be fixed to an outdoor environment (e.g., a building wall or utility pole). The base 130 has a recess 131 and an engaging hole 132 communicated with each other. The recess 131 is configured to accommodate at least a part of the main body 110. The engaging hole 132 is configured to be engaged with the pressing portion 121. By pressing the pressing portion 121 to make it sink into the through hole 111a, the pressing portion 121 is disengaged from the engaging hole 132, so that the main body 110 can be detached from the base 130. Structures and functions of components included in the housing assembly 100 and connection relationships among the components are described in detail below.

Figure 2A:
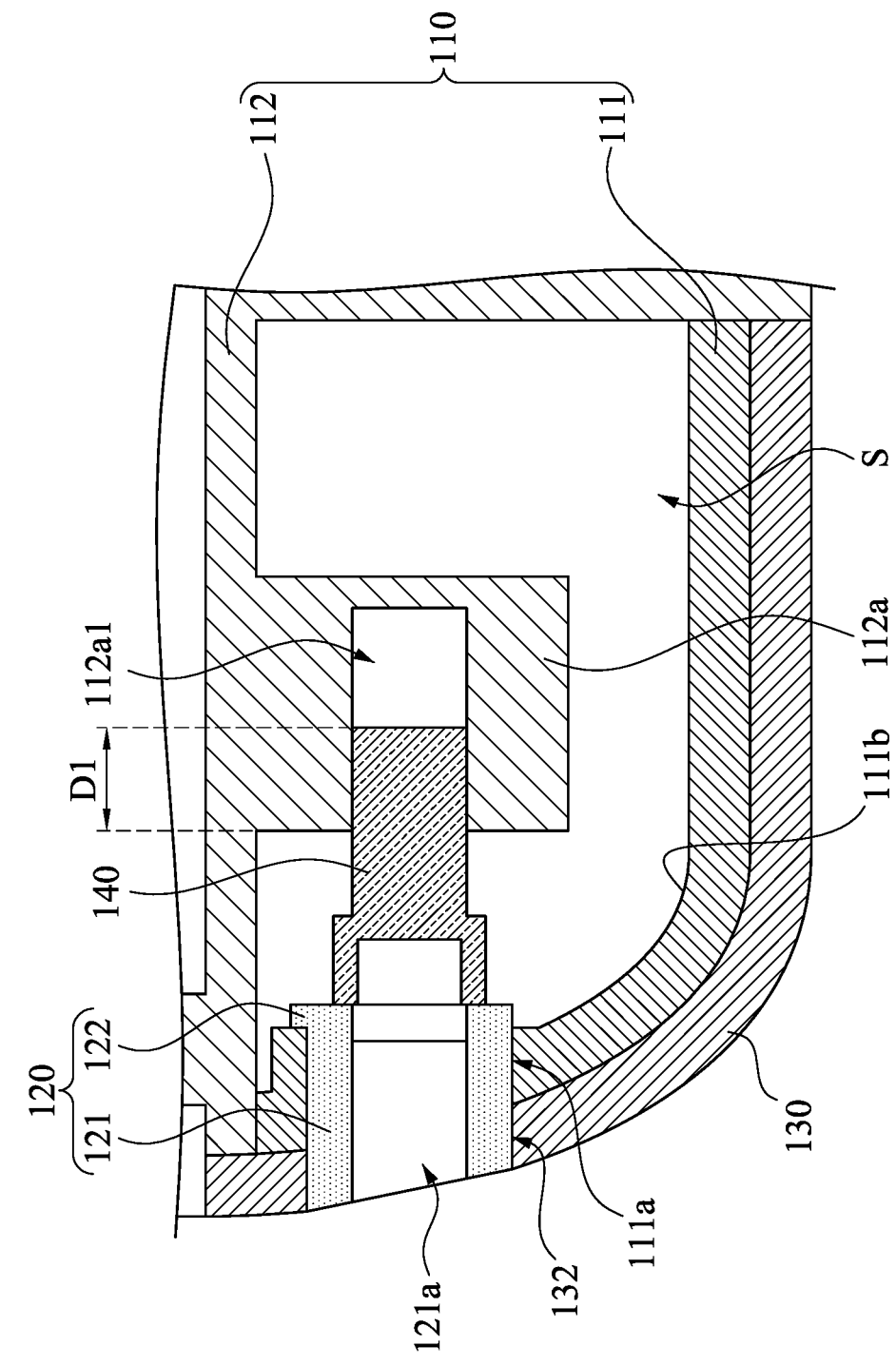
FIG. 2A is a partial cross-sectional view of the housing assembly according to an embodiment of the disclosure.

Reference is made to FIG. 2A. FIG. 2A is a partial cross-sectional view of the housing assembly 100 according to an embodiment of the disclosure. As shown in FIG. 2A, in the present embodiment, the housing assembly 100 further includes a fixing member 140. The main body 110 includes a connecting portion 112a located in the inner space S. The connecting portion 112a has a connecting hole 112a1.

The fixing member 140 is connected to the connecting hole 112a1. When the fixing member 140 enters the connecting hole 112a1 for a first depth D1 and is fixed to the connecting hole 112a1 and the pressing portion 121 abuts against the fixing member 140, the pressing portion 121 partially protrudes out of the main body 110 from the through hole 111a and is engaged with the engaging hole 132 of the base 130. As a result, in the case shown in FIG. 2A, the pressing portion 121 cannot be pressed to sink into the through hole 111a. In addition, the main body 110 has an inner surface 111b. The button 120 further includes a stopping portion 122. The stopping portion 122 is connected to the pressing portion 121 and configured to abut against the inner surface 111b. As such, the button 120 can be prevented from completely falling out of the main body 110 from the through hole 111a.

Figure 2B:
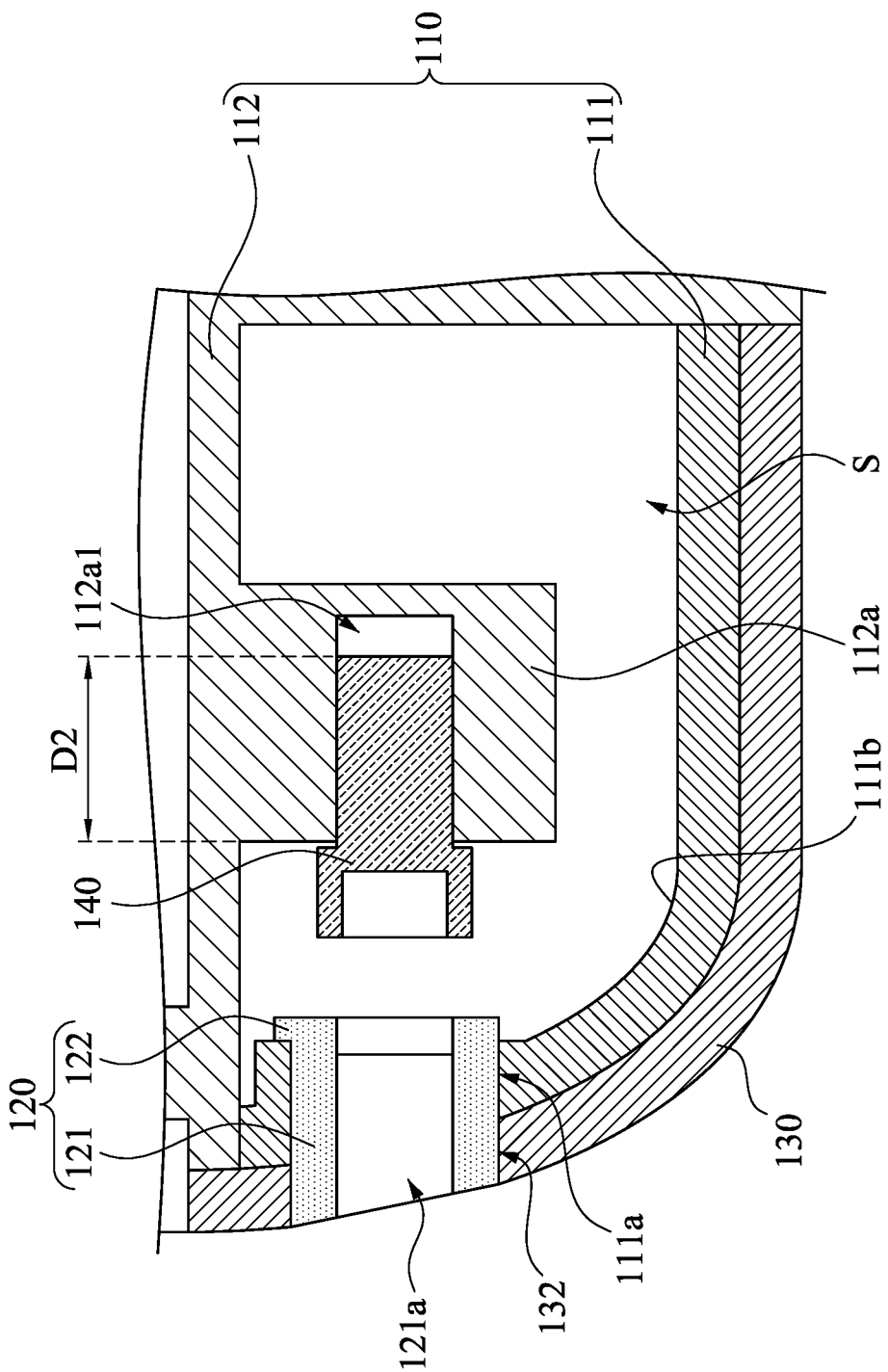
FIG. 2B is another partial cross-sectional view of the housing assembly shown in FIG. 2A.
Figure 2C:
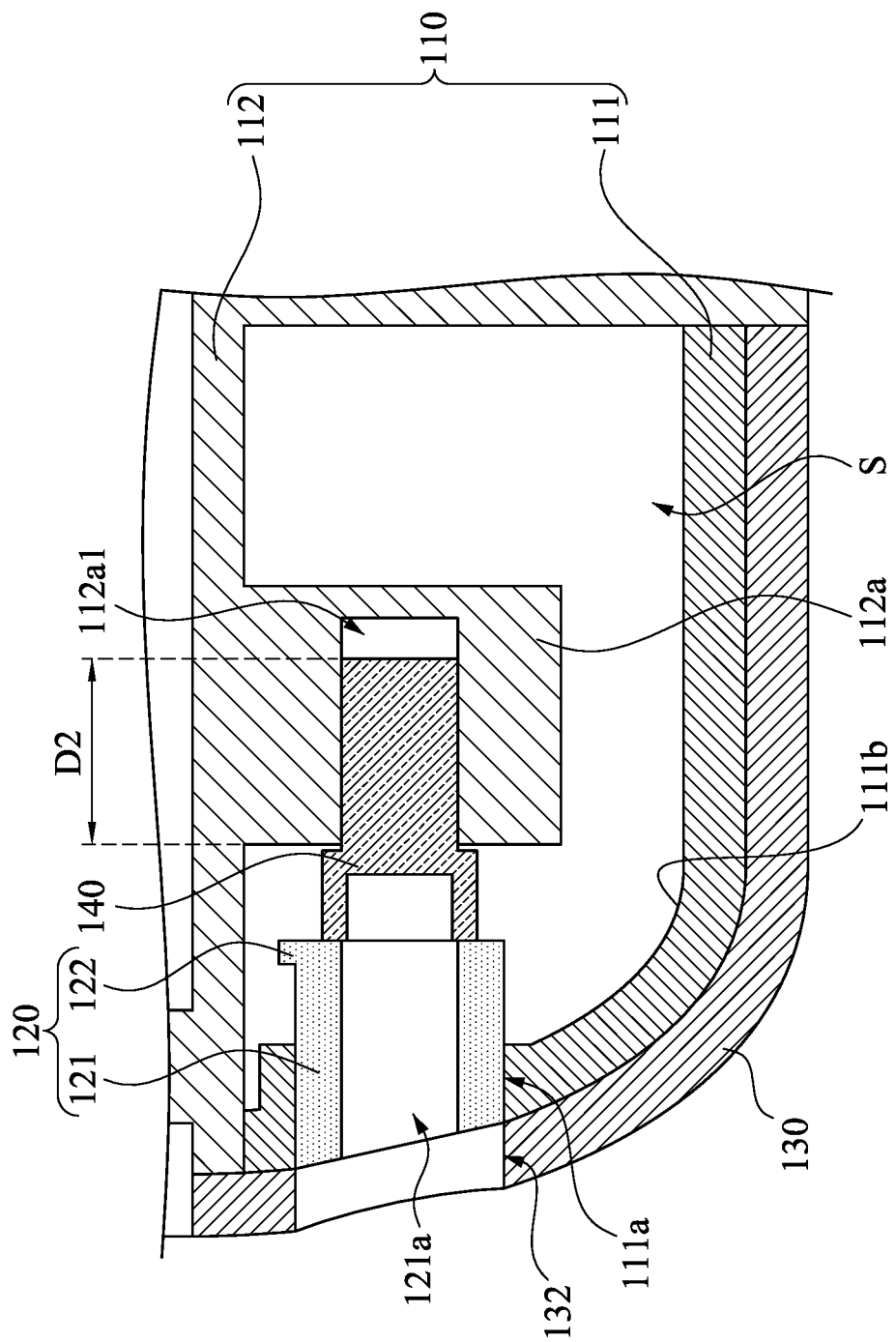
FIG. 2C is a partial cross-sectional view of the housing assembly shown in FIG. 2B in another operating state.

Reference is made to FIGS. 2B and 2C. FIG. 2B is another partial cross-sectional view of the housing assembly 100 shown in FIG. 2A. FIG. 2C is a partial cross-sectional view of the housing assembly 100 shown in FIG. 2B in another operating state. As shown in FIG. 2B, when the fixing member 140 enters the connecting hole 112a1 for a second depth D2, which is greater than the first depth D1, a distance between the fixing member 140 and the button 120 is formed for the button 120 to be pressed into the inner space S. As shown in FIG. 2C, when the pressing portion 121 is pressed to abut against the fixing member 140, the pressing portion 121 sinks into the through hole 111a and disengages from the engaging hole 132.

In some embodiments, the connecting hole 112a1 is a screw hole. The fixing member 140 is a screw and is screwed with the connecting hole 112a1. By rotating the fixing member 140 relative to the connecting hole 112a1, the depth of the fixing member 140 entering the connecting hole 112a1 can be adjusted, that is, the fixing member 140 is fixed to the connecting hole 112a1 with the capability of adjusting the depth of entry. In some embodiments, as shown in FIG. 2A, in order to rotate the fixing member 140, the pressing portion 121 can be designed with a through passage 121a, and the through passage 121a substantially faces the fixing member 140. As such, a user can have a disassembly tool (e.g., a screwdriver) pass through the pressing portion 121 via the through passage 121a to reach the fixing member 140, and rotate the fixing member 140 by the disassembly tool.

In the embodiment as shown in FIG. 2A, the connecting portion 112a having the connecting hole 112a1 is a part of the cover 112, but the disclosure is not limited in this regard. In other embodiments, the connecting portion 112a having the connecting hole 112a1 can be a part of the supporting bracket 111.

Figure 3A:
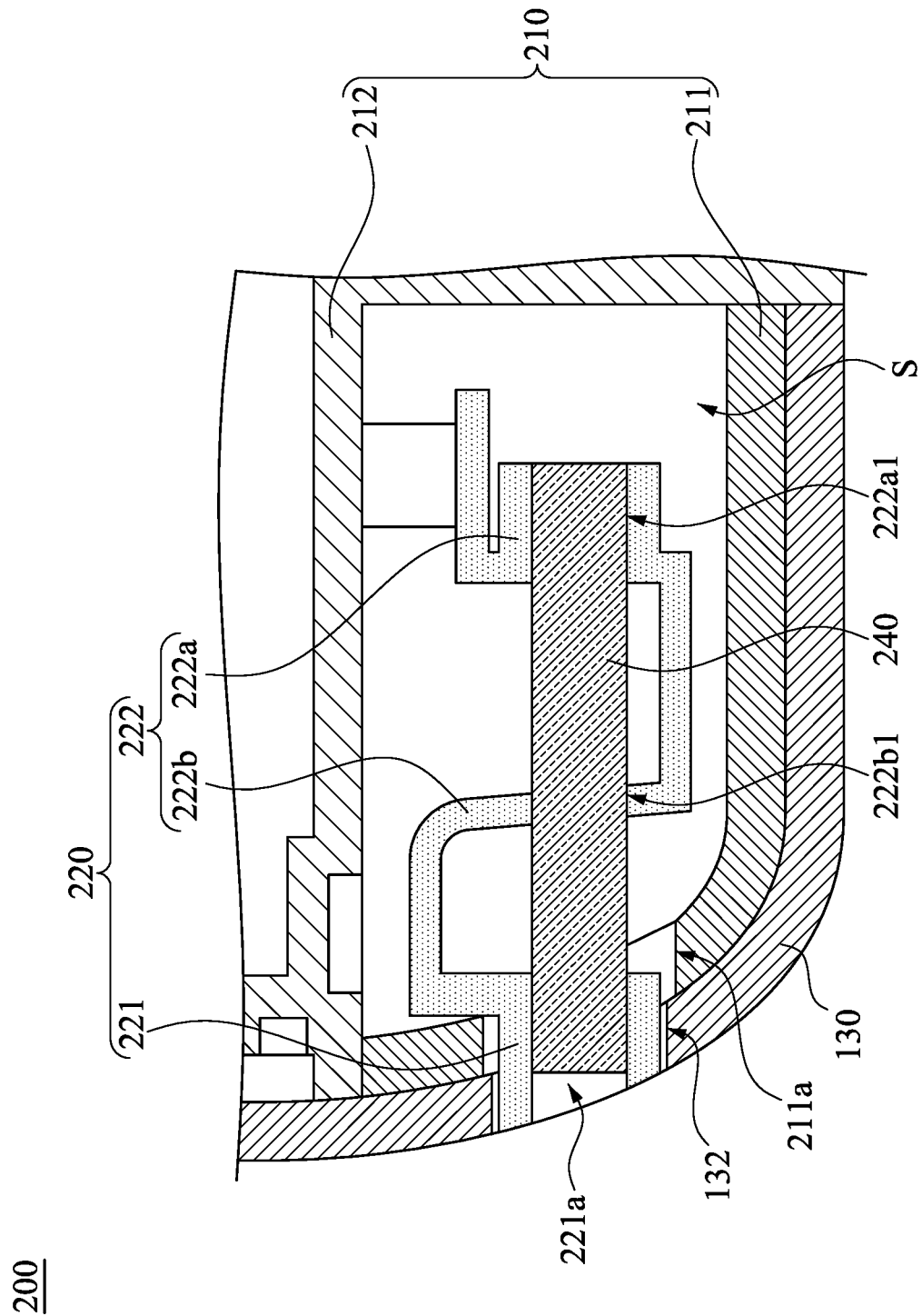
FIG. 3A is a partial cross-sectional view of a housing assembly according to an embodiment of the disclosure.

Reference is made to FIG. 3A. FIG. 3A is a partial cross-sectional view of a housing assembly 200 according to an embodiment of the disclosure. As shown in FIG. 3A, in the present embodiment, the housing assembly 200 includes a main body 210, a button 220, a base 130, and a fixing member 240. The main body 210 includes a supporting bracket 211 and a cover 212. The main body 210 has an inner space S and a through hole 211a communicated with each other. The button 220 includes a pressing portion 221 and an elastic arm portion 222. The pressing portion 221 protrudes out of the main body 210 from the through hole 211a. The pressing portion 221 is configured to be pressed to push the elastic arm portion 222 and sink into the through hole 211a by the deformation of the elastic arm portion 222. The base 130 is identical or similar to that of the embodiment as shown in FIG. 2A, so the details thereof would not be repeated here.

Specifically, in the present embodiment, the elastic arm portion 222 includes a first connecting section 222a and a second connecting section 222b. The first connecting section 222a is coupled to the main body 210 in the inner space S and has a connecting hole 222a1. The second connecting section 222b is connected between the first connecting section 222a and the pressing portion 221 and has a passing hole 222b1. The fixing member 240 slidably passes through the passing hole 222b1 and passes into the connecting hole 222a1. It should be pointed out that since the fixing member 240 passes through the passing hole 222b1 of the second connecting section 222b and passes into the connecting hole 222a1 of the first connecting section 222a, the fixing member 240 hinders the relative bending deformation of the first connecting section 222a and the second connecting section 222b. In addition, the pressing portion 221 has a through passage 221a, and the fixing member 240 slidably passes into the through passage 221a, so the fixing member 240 further hinders the relative bending deformation of the second connecting section 222b and the pressing portion 221. As a result, in the case shown in FIG. 3A, the pressing portion 221 cannot be pressed to sink into the through hole 211a.

In some embodiments, the connecting hole 222a1 is a screw hole. The fixing member 240 is a screw and is screwed with the connecting hole 222a1. By screwing the fixing member 240 with the connecting hole 222a1, the fixing member 240 can be prevented from completely falling out of the main body 210 from the through hole 211a.

Figure 3B:
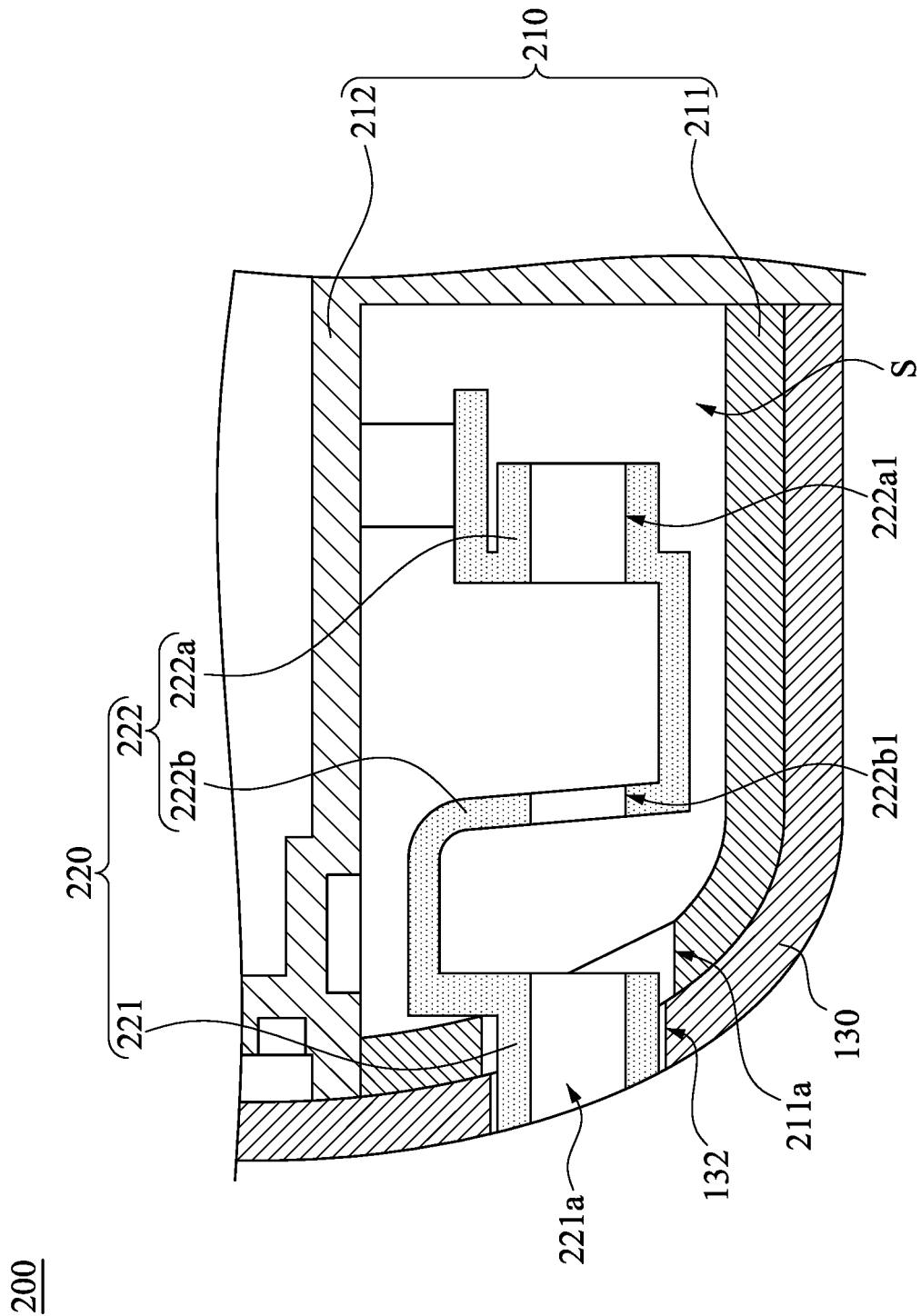
FIG. 3B is another partial cross-sectional view of the housing assembly shown in FIG. 3A, in which a fixing member is removed.
Figure 3C:
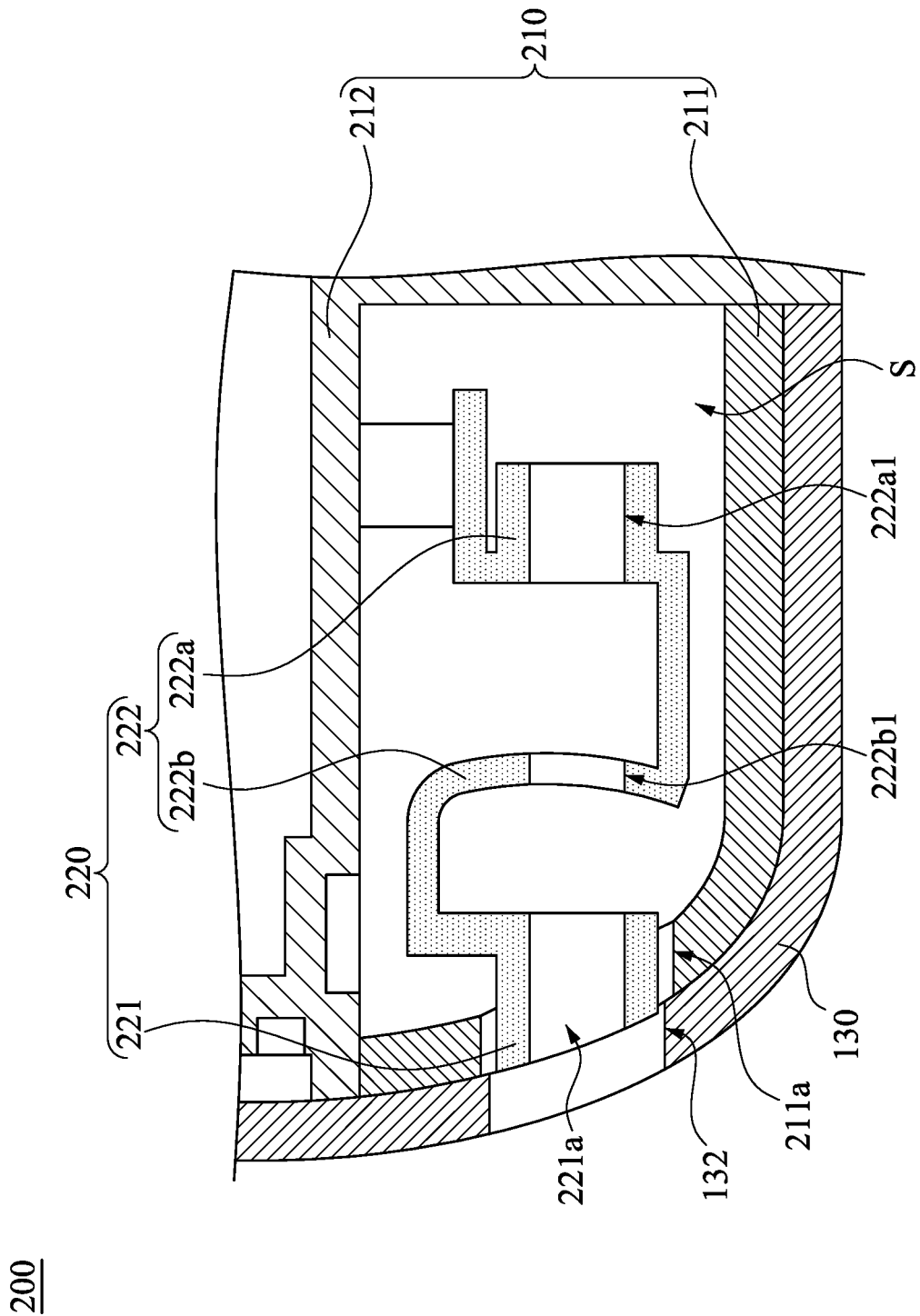
FIG. 3C is a partial cross-sectional view of the housing assembly shown in FIG. 3B in another operating state.

Reference is made to FIGS. 3B and 3C. FIG. 3B is another partial cross-sectional view of the housing assembly 200 shown in FIG. 3A, in which the fixing member 240 is removed. FIG. 3C is a partial cross-sectional view of the housing assembly 200 shown in FIG. 3B in another operating state. As shown in FIGS. 3B and 3C, when the fixing member 240 is detached and is completely separated from the main body 210, the first connecting section 222a and the second connecting section 222b can bend and deform relative to each other, and the second connecting section 222b and the pressing portion 221 can bend and deform relative to each other, so as to allow the pressing portion 221 to sink into the through hole 211a and disengages from the engaging hole 132.

Figure 4A:
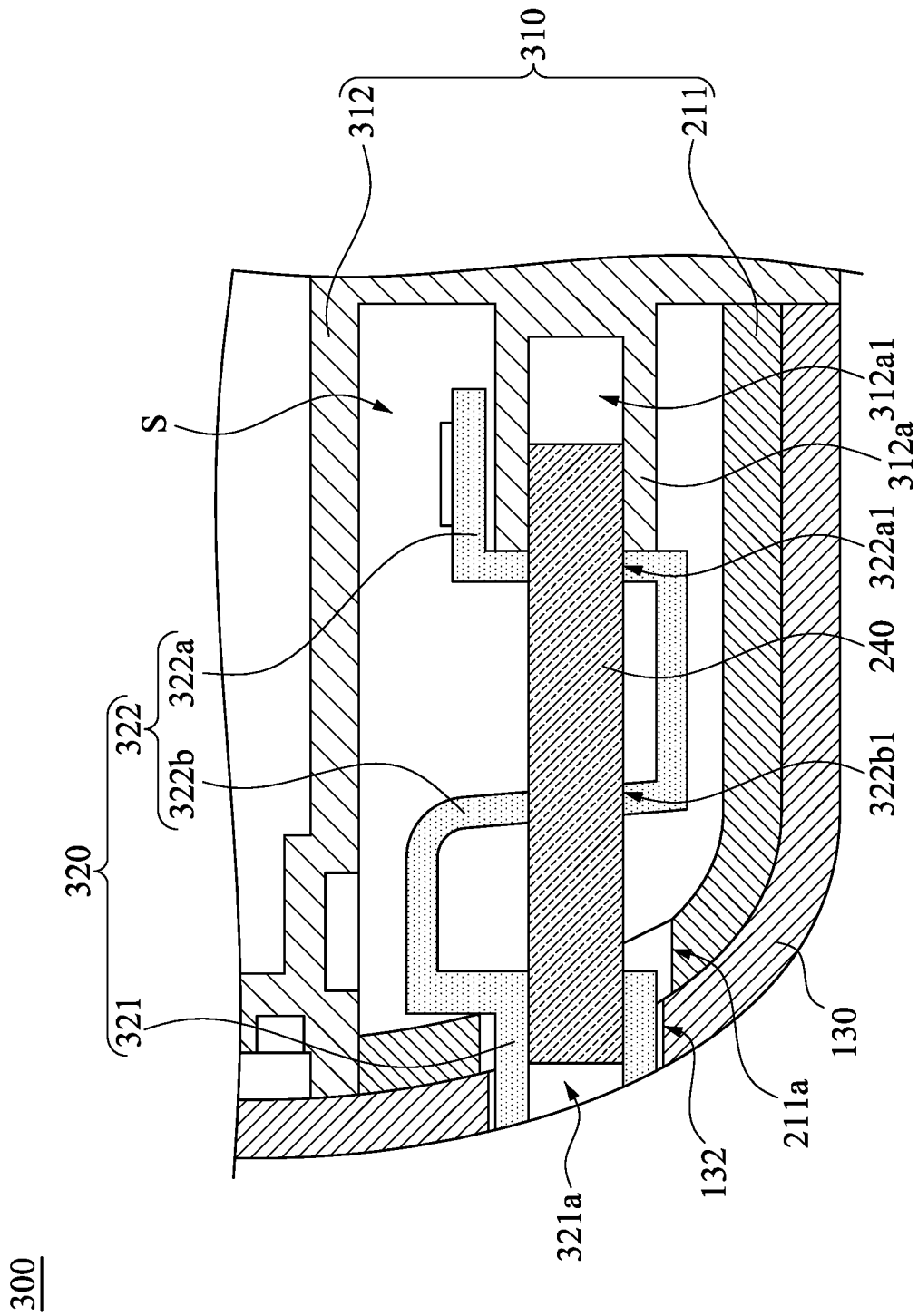
FIG. 4A is a partial cross-sectional view of a housing assembly according to an embodiment of the disclosure.

Reference is made to FIG. 4A. FIG. 4A is a partial cross-sectional view of a housing assembly 300 according to an embodiment of the disclosure. As shown in FIG. 4A, in the present embodiment, the housing assembly 300 includes a main body 310, a button 320, a base 130, and a fixing member 240. The main body 310 includes a supporting bracket 211 and a cover 312. The main body 310 has an inner space S and a through hole 211a communicated with each other. The button 320 includes a pressing portion 321 and an elastic arm portion 322. The pressing portion 321 protrudes out of the main body 310 from the through hole 211a. The pressing portion 321 is configured to be pressed to push the elastic arm portion 322 and sink into the through hole 211a by the deformation of the elastic arm portion 322. The base 130 and the supporting bracket 211 are identical or similar to those of the embodiment as shown in FIG. 3A, so the details thereof would not be repeated here.

Specifically, in the present embodiment, the elastic arm portion 322 includes a first connecting section 322a and a second connecting section 322b. The first connecting section 322a is coupled to the main body 310 in the inner space S and has a first passing hole 322a1. The second connecting section 322b is connected between the first connecting section 322a and the pressing portion 321 and has a second passing hole 322b1. The main body 310 includes a connecting portion 312a located in the inner space S. The connecting portion 312a has a connecting hole 312a1. In the present embodiment, the connecting hole 312a1 is a screw hole; the fixing member 240 is a screw, and the fixing member 240 sequentially passes through the second passing hole 322b1 of the second connecting section 322b and the first passing hole 322a1 of the first connecting section 322a and is screwed with the connecting hole 312a1, so the fixing member 240 hinders the relative bending deformation of the first connecting section 322a and the second connecting section 322b. In addition, the pressing portion 321 has a through passage 321a, and the fixing member 240 slidably passes into the through passage 321a, so the fixing member 240 further hinders the relative bending deformation of the second connecting section 322b and the pressing portion 321. As a result, in the case shown in FIG. 4A, the pressing portion 321 cannot be pressed to sink into the through hole 211a.

Figure 4B:
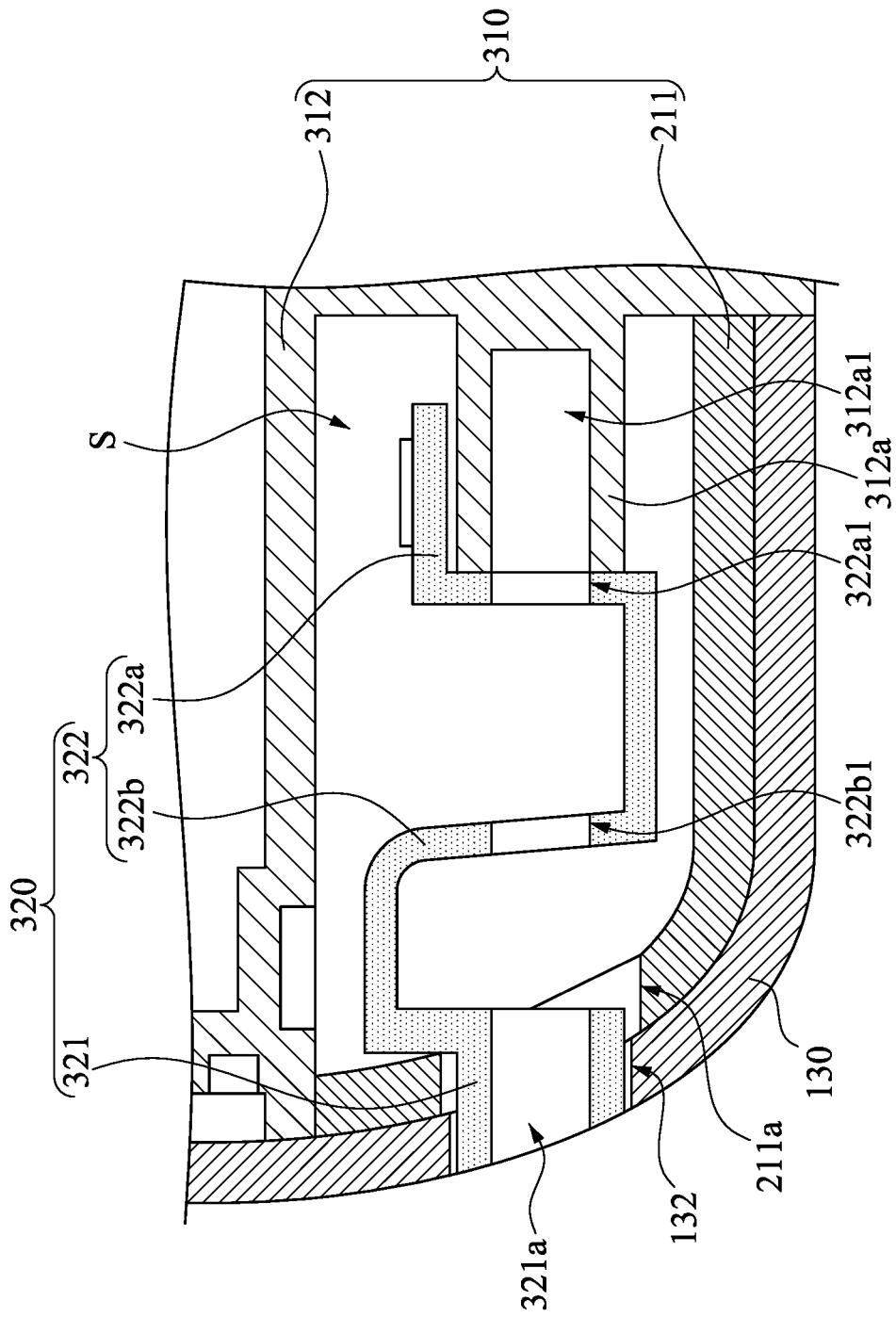
FIG. 4B is another partial cross-sectional view of the housing assembly shown in FIG. 4A, in which a fixing member is removed.
Figure 4C:
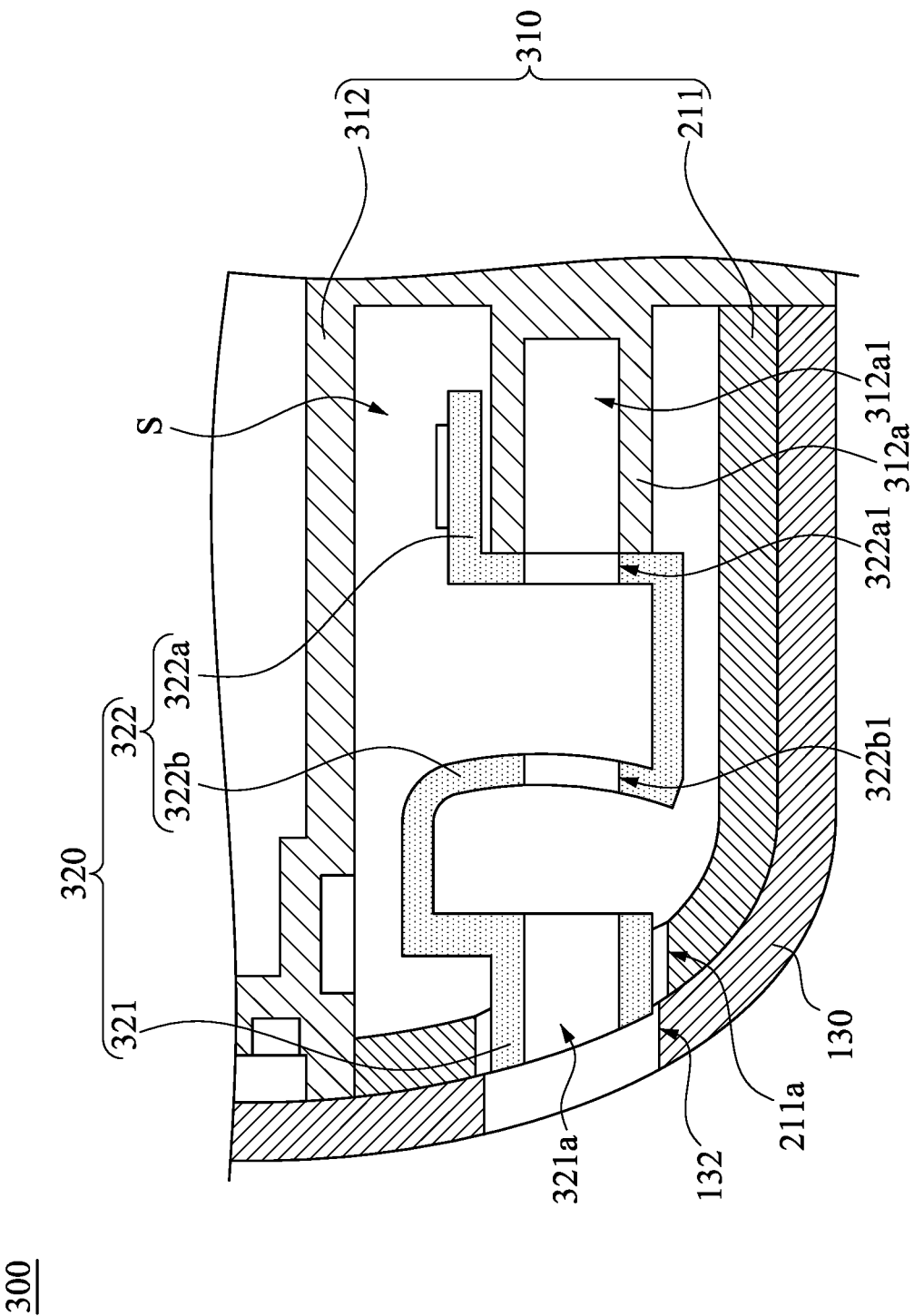
FIG. 4C is a partial cross-sectional view of the housing assembly shown in FIG. 4B in another operating state.

Reference is made to FIGS. 4B and 4C. FIG. 4B is another partial cross-sectional view of the housing assembly 300 shown in FIG. 4A, in which the fixing member 240 is removed. FIG. 4C is a partial cross-sectional view of the housing assembly 300 shown in FIG. 4B in another operating state. As shown in FIGS. 4B and 4C, when the fixing member 240 is detached and is completely separated from the main body 310, the first connecting section 322a and the second connecting section 322b can bend and deform relative to each other, and the second connecting section 322b and the pressing portion 321 can bend and deform relative to each other, so as to allow the pressing portion 321 to sink into the through hole 211a and disengages from the engaging hole 132.

In the embodiment as shown in FIG. 4A, the connecting portion 312a having the connecting hole 312a1 is a part of the cover 312, but the disclosure is not limited in this regard. In other embodiments, the connecting portion 312a having the connecting hole 312a1 can be a part of the supporting bracket 211.

Figure 5A:
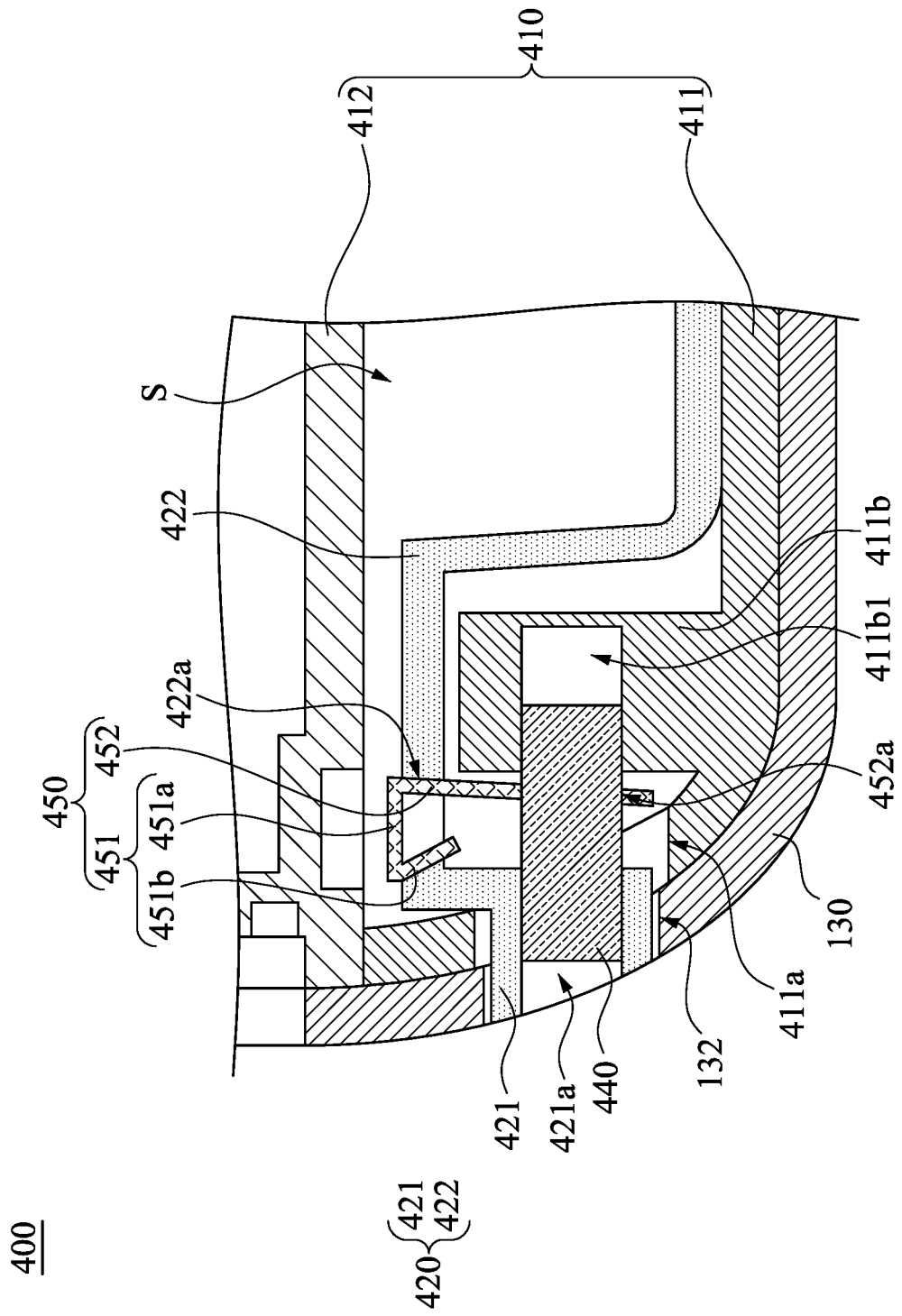
FIG. 5A is a partial cross-sectional view of a housing assembly according to an embodiment of the disclosure.

Reference is made to FIG. 5A. FIG. 5A is a partial cross-sectional view of a housing assembly 400 according to an embodiment of the disclosure. As shown in FIG. 5A, in the present embodiment, the housing assembly 400 includes a main body 410, a button 420, a base 130, and a fixing member 440. The main body 410 includes a supporting bracket 411 and a cover 412. The main body 410 has an inner space S and a through hole 411a communicated with each other. The button 420 includes a pressing portion 421 and an elastic arm portion 422. The pressing portion 421 protrudes out of the main body 410 from the through hole 411a. The pressing portion 421 is configured to be pressed to push the elastic arm portion 422 and sink into the through hole 411a by the deformation of the elastic arm portion 422. The base 130 is identical or similar to that of the embodiment as shown in FIG. 2A, so the details thereof would not be repeated here.

Figure 7:
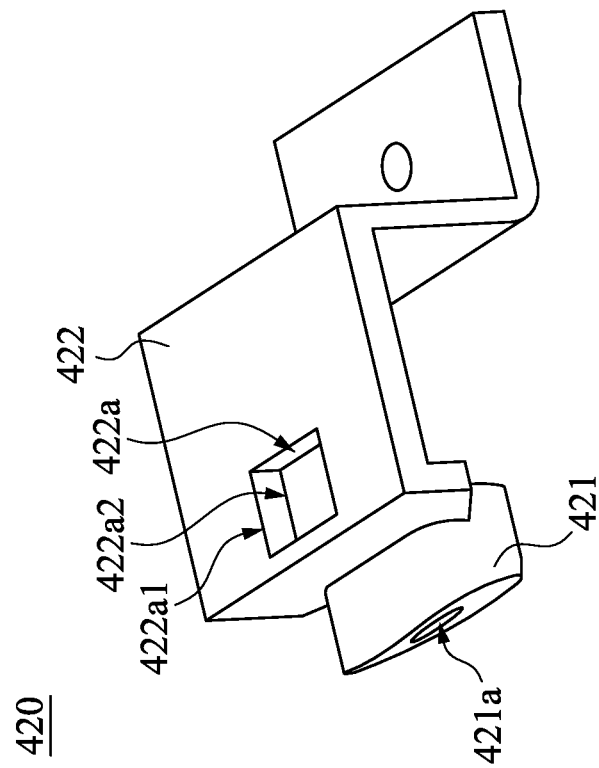
FIG. 7 is a perspective view of a button shown in FIG. 5A.
Figure 6:
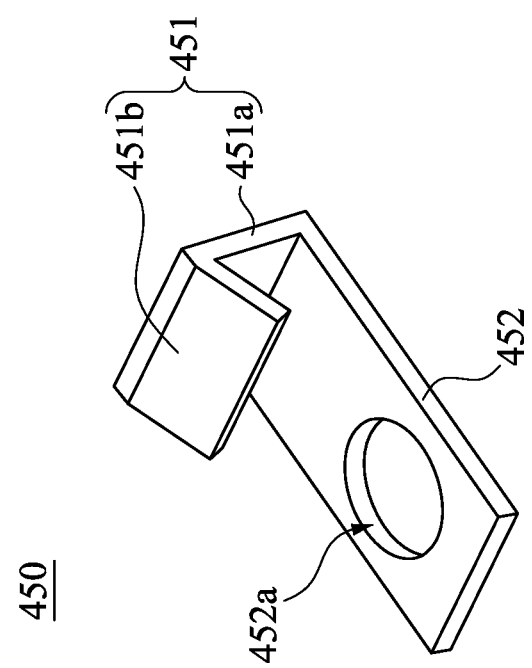
FIG. 6 is a perspective view of a blocking plate shown in FIG. 5A.

Reference is made to FIGS. 6 and 7. FIG. 6 is a perspective view of a blocking plate 450 shown in FIG. 5A. FIG. 7 is a perspective view of the button 420 shown in FIG. 5A. As shown in FIGS. 5A, 6, and 7, in the present embodiment, the elastic arm portion 422 has a first hole 422a. The housing assembly 400 further includes the blocking plate 450. The blocking plate 450 includes a stopping portion 451 and an extending portion 452 connected to each other. The stopping portion 451 is configured to be inserted into the first hole 422a. An end of the extending portion 452 passes through the first hole 422a and has a second hole 452a. Another end of the extending portion 452 is connected to the stopping portion 451. The main body 410 includes a connecting portion 411b located in the inner space S. The connecting portion 411b has a connecting hole 411b1. The fixing member 440 passes through the second hole 452a and is connected to the connecting hole 411b1, so that the fixing member 440 retains the blocking plate 450 through the second hole 452a, thereby causing the stopping portion 451 to keep being inserted into the first hole 422a. Since the fixing member 440 limits the freedom of movement of the extending portion 452 relative to the connecting hole 411b1, and the stopping portion 451 inserted into the first hole 422a limits the freedom of the elastic arm portion 422, the bending deformation of the elastic arm portion 422 is hindered. As a result, in the case shown in FIG. 5A, the pressing portion 421 cannot be pressed to sink into the through hole 411a.

Figure 5B:
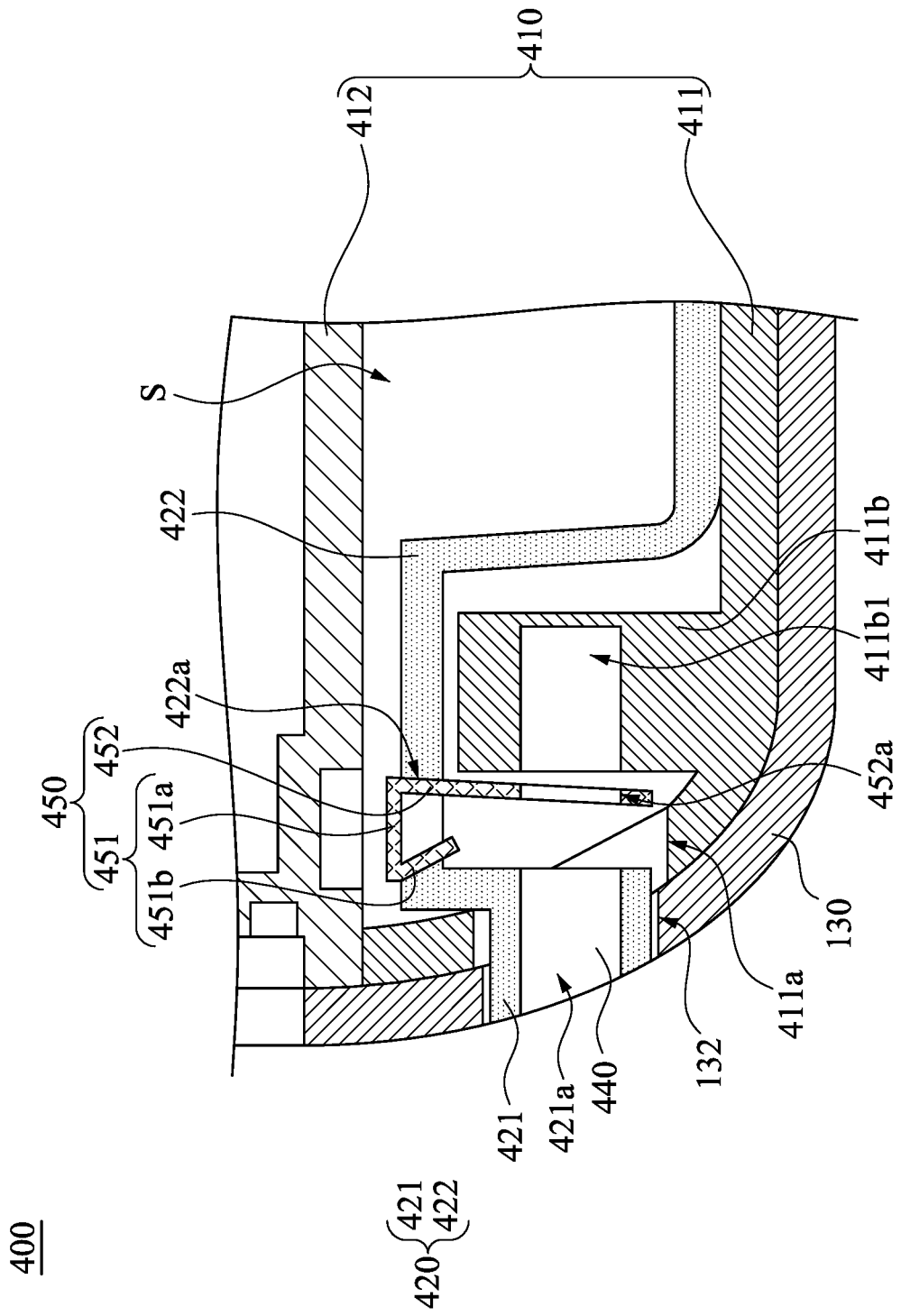
FIG. 5B is another partial cross-sectional view of the housing assembly shown in FIG. 5A, in which a fixing member is removed.
Figure 5C:
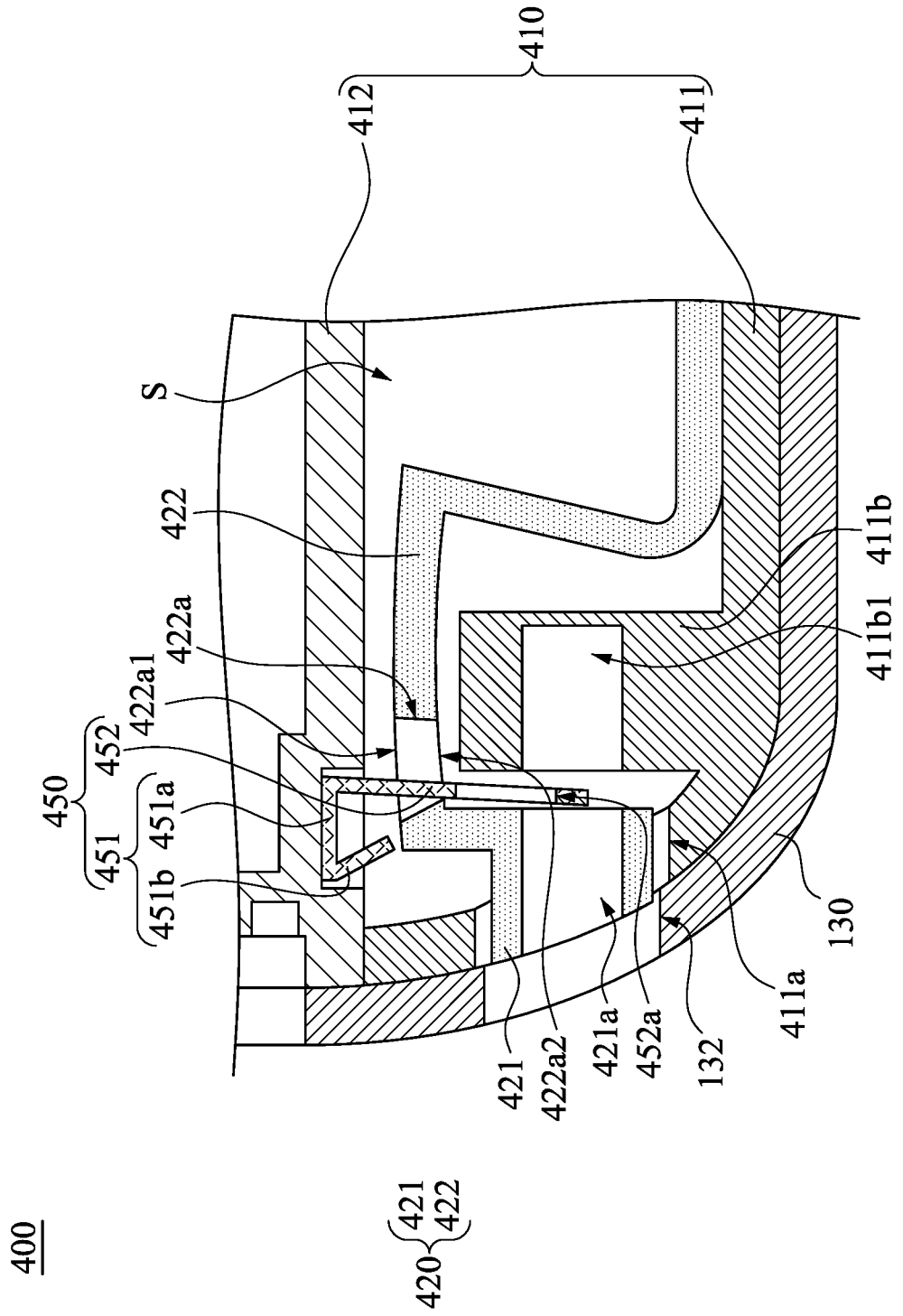
FIG. 5C is a partial cross-sectional view of the housing assembly shown in FIG. 5B in another operating state.

Reference is made to FIGS. 5B and 5C. FIG. 5B is another partial cross-sectional view of the housing assembly 400 shown in FIG. 5A, in which the fixing member 440 is removed. FIG. 5C is a partial cross-sectional view of the housing assembly 400 shown in FIG. 5B in another operating state. As shown in FIGS. 5B and 5C, when the fixing member 440 is detached and is completely separated from the main body 410 (e.g., via the through passage 421a of the pressing portion 421) and the stopping portion 451 is separated from the first hole 422a, the elastic arm portion 422 can bend and deform, so as to allow the pressing portion 421 to sink into the through hole 411a and disengages from the engaging hole 132.

In some embodiments, as shown in FIGS. 5B, 5C, and 6, the stopping portion 451 includes a first bending section 451a and a second bending section 451b. The first bending section 451a is connected to the extending portion 452 and bent relative to the extending portion 452. The second bending section 451b is connected to the first bending section 451a, bent relative to the first bending section 451a, and configured to be inserted into the first hole 422a. In the case shown in FIG. 5A, the another end of extending portion 452 and the second bending section 451b are both be inserted into the first hole 422a, so the pressing portion 421 cannot be pressed to sink into the through hole 411a. Distances between the second bending section 451b and the extending portion 452 gradually reduce toward the pressing portion 421. With the structural configurations, in the case shown in FIGS. 5B and 5C, in which the fixing member 440 is detached and is completely separated from the main body 410, when the pressing portion 421 is pressed to make the elastic arm portion 422 bend and deform, the second bending section 451b of the blocking plate 450 can be pushed away from the first hole 422a by the deformed elastic arm portion 422, thereby not hindering the deformation of the elastic arm portion 422. In addition, since the pressing portion 421 has the through passage 421a, in the case shown in FIG. 5A, the fixing member 440 can slidably pass into the through passage 421a and hinder the relative bending deformation of the elastic arm portion 422 and the pressing portion 421.

In some alternative embodiments, as shown in FIG. 5C, the first hole 422a has a first opening 422a1 and a second opening 422a2. The first opening 422a1 is away from the second hole 452a, and the second opening 422a2 is adjacent to the second hole 452a. A width of the first opening 422a1 is greater than a width of the second opening 422a2. With the structural configurations, in the case shown in FIGS. 5B and 5C, in which the fixing member 440 is detached and is completely separated from the main body 410, when the pressing portion 421 is pressed to make the elastic arm portion 422 bend and deform, the second bending section 451b of the blocking plate 450 can easily be pushed away from the first hole 422a by the deformed elastic arm portion 422 (i.e., only the extending portion 452 is still inserted into the first hole 422a), thereby not hindering the deformation of the elastic arm portion 422.

In the embodiment as shown in FIG. 5A, the connecting portion 411b having the connecting hole 411b1 is a part of the supporting bracket 411, but the disclosure is not limited in this regard. In other embodiments, the connecting portion 411b having the connecting hole 411b1 can be a part of the cover 412.

In some embodiments, the connecting hole 411b1 is a screw hole. The fixing member 440 is a screw and is screwed with the connecting hole 411b1, but the disclosure is not limited in this regard.

Figure 8A:
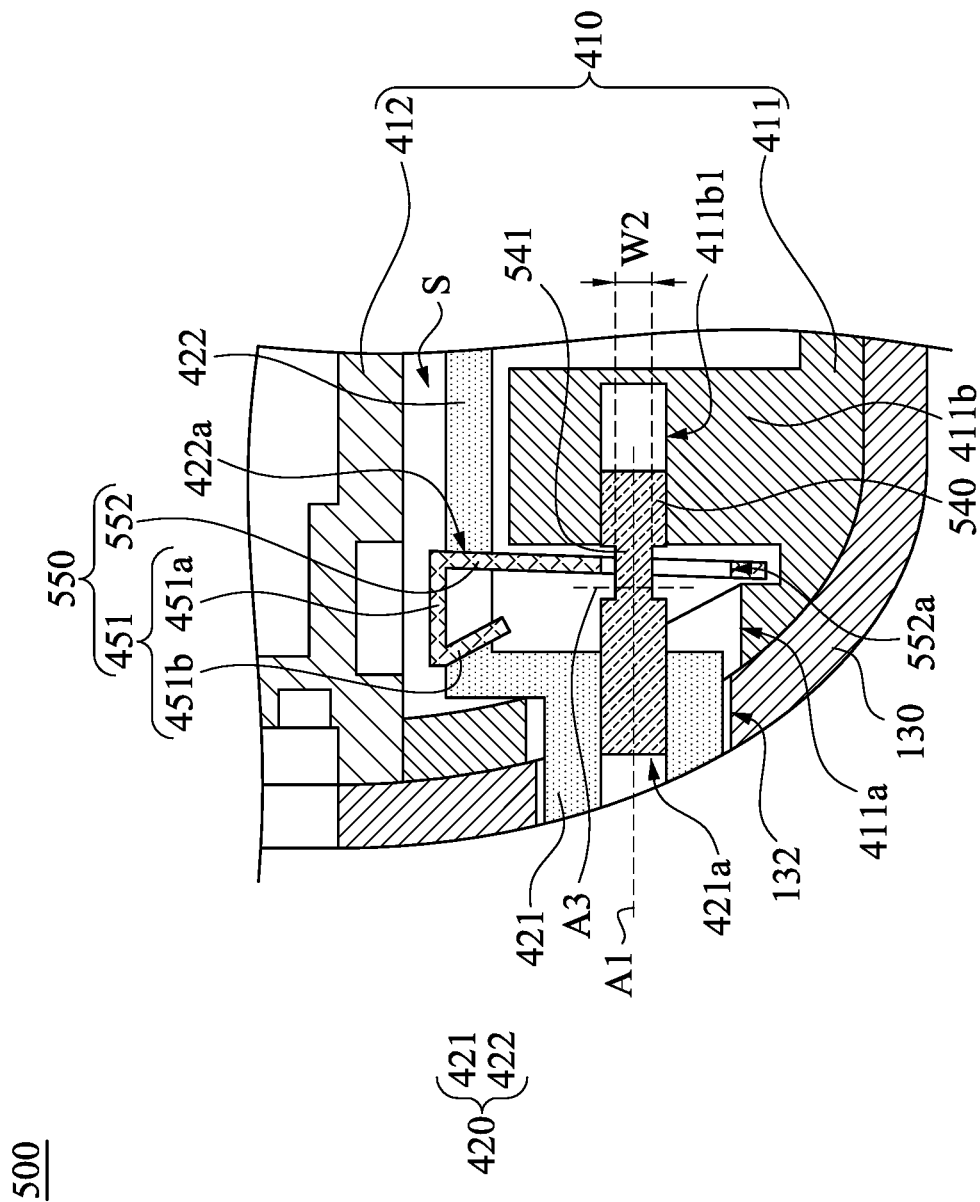
FIG. 8A is a partial cross-sectional view of a housing assembly according to an embodiment of the disclosure.

Reference is made to FIG. 8A. FIG. 8A is a partial cross-sectional view of a housing assembly 500 according to an embodiment of the disclosure. As shown in FIG. 8A, in the present embodiment, the housing assembly 500 includes a main body 410, a button 420, a base 130, and a fixing member 540. The main body 410 includes a supporting bracket 411 and a cover 412. The main body 410 has an inner space S and a through hole 411a communicated with each other. The button 420 includes a pressing portion 421 and an elastic arm portion 422. The pressing portion 421 protrudes out of the main body 410 from the through hole 411a. The pressing portion 421 is configured to be pressed to push the elastic arm portion 422 and sink into the through hole 411a by the deformation of the elastic arm portion 422. The main body 410, the base 130, and the button 420 are identical or similar to those of the embodiment as shown in FIG. 5A, so the details thereof would not be repeated here.

Figure 10:
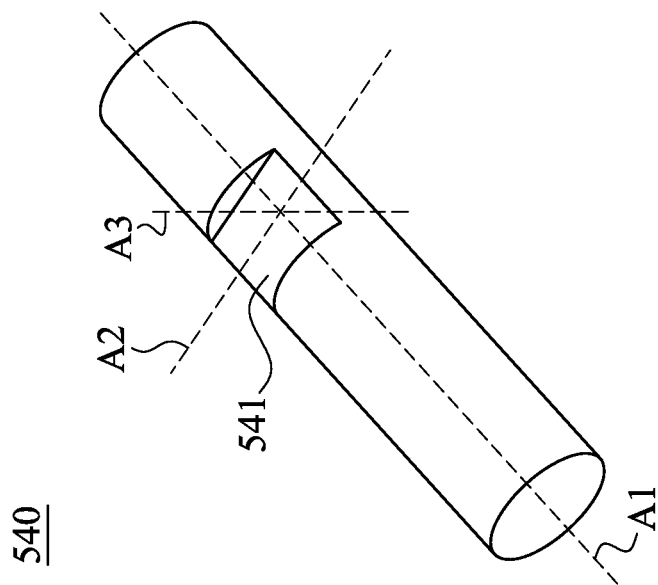
FIG. 10 is a perspective view of a fixing member shown in FIG. 8A.
Figure 9:
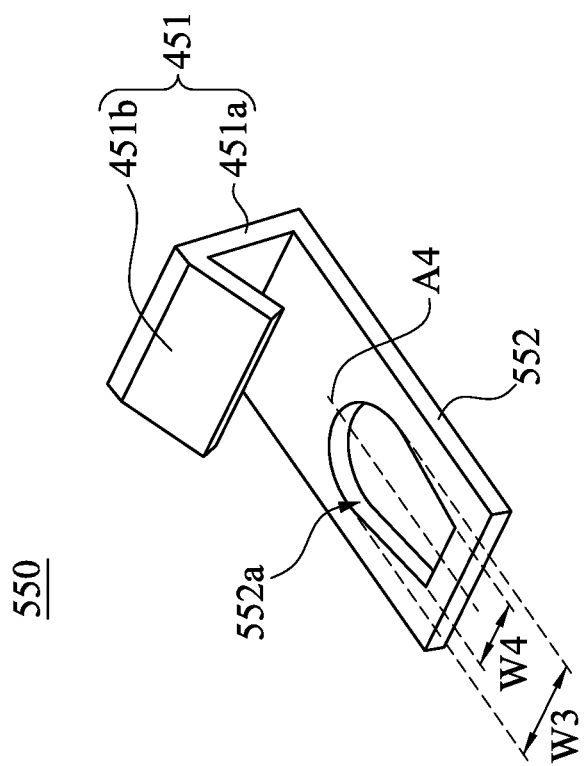
FIG. 9 is a perspective view of a blocking plate shown in FIG. 8A.

Reference is made to FIGS. 9 and 10. FIG. 9 is a perspective view of a blocking plate 550 shown in FIG. 8A. FIG. 10 is a perspective view of the fixing member 540 shown in FIG. 8A. As shown in FIGS. 8A, 9, and 10, in the present embodiment, the housing assembly 500 further includes the blocking plate 550. The blocking plate 550 includes a stopping portion 451 and an extending portion 552 connected to each other. The stopping portion 451 is configured to be inserted into the first hole 422a. The extending portion 552 passes through the first hole 422a and has a second hole 552a. The main body 410 includes a connecting portion 411b having a connecting hole 411b1. The fixing member 540 passes through the second hole 552a and is connected to the connecting hole 411b1, so as to retain the blocking plate 550 through the second hole 552a and cause the stopping portion 451 to keep being inserted into the first hole 422a.

Figure 8B:
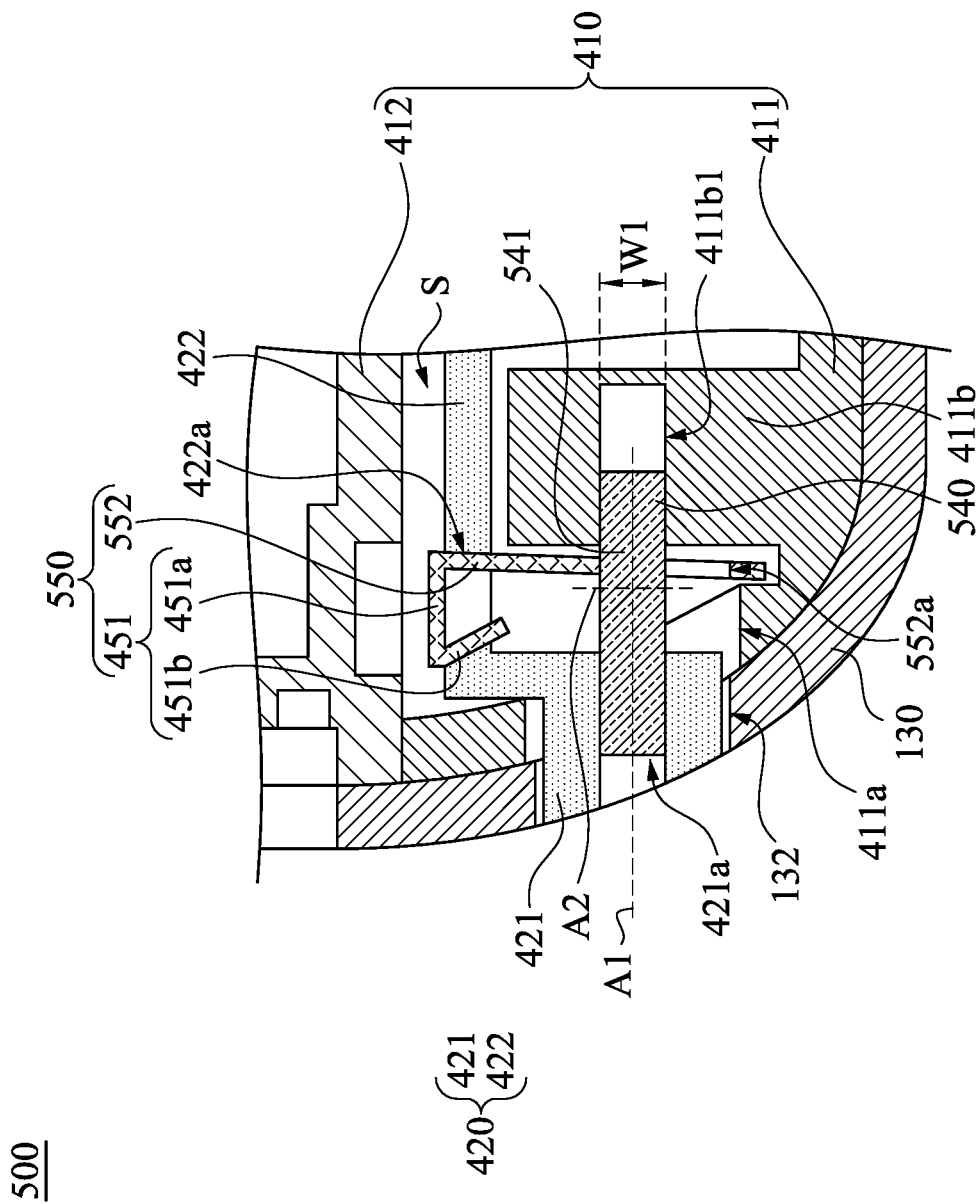
FIG. 8B is another partial cross-sectional view of the housing assembly shown in FIG. 8A.
Figure 8C:
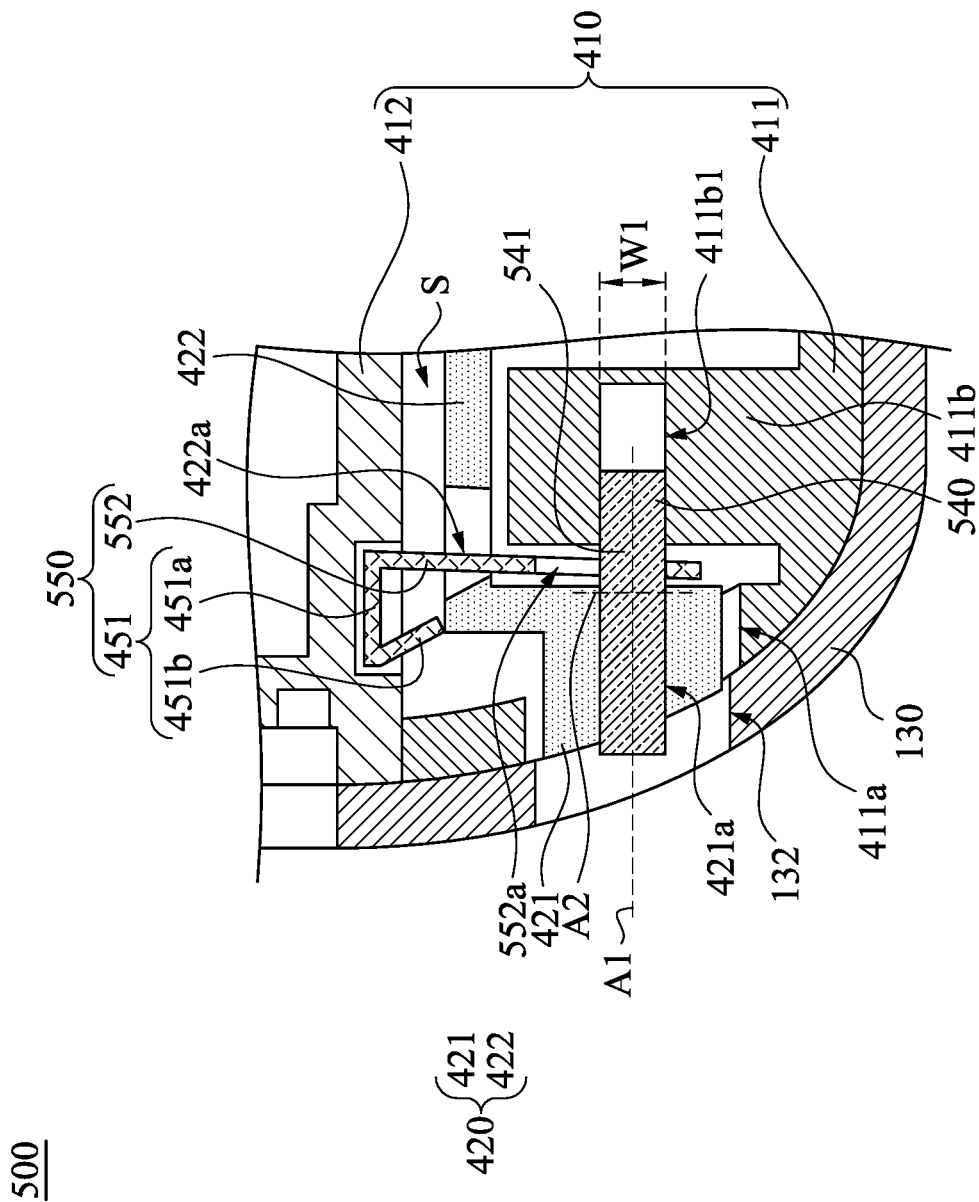
FIG. 8C is a partial cross-sectional view of the housing assembly shown in FIG. 8B in another operating state.

Specifically, the fixing member 540 is rotatably connected to the connecting hole 411b1 with respect to a first axis A1 and has a passing portion 541 inserted into the second hole 552a. The passing portion 541 has a first width W1 (referring to FIGS. 8B and 8C) with respect to a second axis A2 and a second width W2 (referring to FIG. 8A) with respect to a third axis A3 (referring to FIG. 10), and the second axis A2 and the third axis A3 are perpendicular to the first axis A1. In some embodiments, as shown in FIG. 10, the fixing member 540 has a cylindrical shape, and a central portion thereof forming a recess may serve as the passing portion 541 inserted into the second hole 552a. In addition, as shown in FIG. 9, the second hole 552a extends away from the stopping portion 451 substantially along a fourth axis A4 and thus has a long slot shape. The second hole 552a has a third width W3 with respect to the fourth axis A4 at a place adjacent to the stopping portion 451; the second hole 552a has a fourth width W4 with respect to the fourth axis A4 at a place away from the stopping portion 451. The first width W1 is less than the third width W3 and greater than the fourth width W4. The second width W2 is less than the fourth width W4. As such, as shown in FIG. 8 with reference to FIGS. 9 and 10, when the fixing member 540 is rotated such that the third axis A3 thereof is substantially parallel to the fourth axis A4 of the second hole 552a, the passing portion 541 of the fixing member 540 will be stuck by the inner edge of the second hole 552a and cannot move along the fourth axis A4 of the second hole 552a, thereby limiting the blocking plate 550 via the second hole 552a and causing the stopping portion 451 to keep being inserted into the first hole 422a. Since the fixing member 540 limits the freedom of movement of the extending portion 552 relative to the connecting hole 411b1, and the stopping portion 451 inserted into the first hole 422a limits the freedom of the elastic arm portion 422, the bending deformation of the elastic arm portion 422 is hindered. As a result, in the case shown in FIG. 8A, the pressing portion 421 cannot be pressed to sink into the through hole 411a.

Reference is made to FIGS. 8B and 8C. FIG. 8B is another partial cross-sectional view of the housing assembly 500 shown in FIG. 8A. FIG. 8C is a partial cross-sectional view of the housing assembly 500 shown in FIG. 8B in another operating state. As shown in FIGS. 8B and 8C with reference to FIGS. 9 and 10, since the second width W2 is less than the fourth width W4, when the fixing member 540 is rotated such that the second axis A2 thereof is parallel to the fourth axis A4 of the second hole 552a, the passing portion 541 of the fixing member 540 will not be stuck by the inner edge of the second hole 552a and can move along the fourth axis A4 of the second hole 552a. That is, when the pressing portion 421 is pressed, since the fixing member 540 gives the freedom of movement of the extending portion 552 relative to the connecting hole 411b1, the stopping portion 451 can be separated from the first hole 422a. As such, the elastic arm portion 422 can bend and deform, so as to allow the pressing portion 421 to sink into the through hole 411a and disengages from the engaging hole 132.

It should be pointed out that in the present embodiment, the fixing member 540 can rotate relative to the connecting hole 411b1 without being removed out of the main body 410 from the through passage 421a, thereby reducing the problem of that the fixing member 540 is lost due to falling.

In addition, The mechanism in which the bent and deformed elastic arm portion 422 pushes the stopping portion 451 of the blocking plate 550 away from the first hole 422a is identical or similar to the embodiment shown in FIGS. 5A to 5C, and will not be described herein.

In some embodiments, the second axis A2 and the third axis A3 are perpendicular to each other, but the disclosure is not limited in this regard.

According to the foregoing recitations of the embodiments of the disclosure, it can be seen that the housing assembly of the present disclosure integrates the button and the fixing member into the main body and makes them cooperate to perform the function of anti-theft. Specifically, by installing the fixing member in the main body or adjusting the fixing member that has been installed in the main body, the button can be blocked by the fixing member and cannot be pressed, so that the main body cannot be disassembled relative to the base correspondingly; by removing the fixing member from the main body or adjusting the fixing member that has been installed in the main body, the button can detach from the fixing member and is allowed to be pressed, so that the main body is allowed to be disassembled relative to the base correspondingly. Since the button cannot be pressed when it is blocked by the fixing member, the damage probability of the button can be effectively reduced, thereby increasing the service life of the button.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A housing assembly, comprising:
   a main body having an inner space and a through hole communicated with each other;
   a button comprising a pressing portion, the pressing portion protruding out of the main body from the through hole and being configured to be pressed to sink into the through hole;
   a base having a recess and an engaging hole communicated with each other, the recess being configured to accommodate the main body, and the engaging hole being configured to be engaged with the pressing portion; and
   a fixing member coupled to the main body in the inner space and configured to block the pressing portion from sinking into the through hole and disengaging from the engaging hole.

2. The housing assembly of claim 1, wherein the main body comprises a connecting portion located in the inner space, the connecting portion has a connecting hole, the fixing member is connected to the connecting hole, wherein when the fixing member enters the connecting hole for a first depth and the pressing portion abuts against the fixing member, the pressing portion partially protrudes out of the main body from the through hole, and when the fixing member enters the connecting hole for a second depth, the pressing portion sinks into the through hole.

3. The housing assembly of claim 2, wherein the pressing portion has a through passage substantially facing the fixing member.

4. The housing assembly of claim 2, wherein the main body has an inner surface, the button further comprises a stopping portion connected to the pressing portion and configured to abut against the inner surface.

5. The housing assembly of claim 2, wherein the connecting hole is a screw hole, the fixing member is a screw and is screwed with the connecting hole.

6. The housing assembly of claim 1, wherein the button further comprises an elastic arm portion, and the elastic arm portion comprises:
   a first connecting section coupled to the main body in the inner space and having a connecting hole; and
   a second connecting section connected between the first connecting section and the pressing portion and having a passing hole,
   wherein the fixing member slidably passes through the passing hole and passes into the connecting hole.

7. The housing assembly of claim 6, wherein the main body further has a screw hole located in the inner space, the fixing member is a screw and sequentially passes through the passing hole and the connecting hole to be screwed with the screw hole.

8. The housing assembly of claim 6, wherein the connecting hole is a screw hole, the fixing member is a screw and is screwed with the connecting hole.

9. The housing assembly of claim 6, wherein the pressing portion has a through passage, and the fixing member is slidably connected to the through passage.

10. The housing assembly of claim 1, wherein the button further comprises an elastic arm portion having a first hole, the housing assembly further comprises a blocking plate, the blocking plate comprises a stopping portion and an extending portion connected to each other, the stopping portion is configured to be inserted into the first hole, the extending portion passes through the first hole and has a second hole, the main body comprises a connecting portion located in the inner space, the connecting portion has a connecting hole, the fixing member passes through the second hole and is connected to the connecting hole, so as to retain the blocking plate through the second hole.

11. The housing assembly of claim 10, wherein the stopping portion comprises:
   a first bending section connected to the extending portion and bent relative to the extending portion; and
   a second bending section connected to the first bending section, bent relative to the first bending section, and configured to be inserted into the first hole.

12. The housing assembly of claim 10, wherein distances between the second bending section and the extending portion gradually reduce toward the pressing portion.

13. The housing assembly of claim 10, wherein the first hole has a first opening and a second opening, the first opening and the second opening are respectively away from and adjacent to the second hole, and a width of the first opening is greater than a width of the second opening.

14. The housing assembly of claim 10, wherein the connecting hole is a screw hole, the fixing member is a screw and is screwed with the connecting hole.

15. The housing assembly of claim 10, wherein the fixing member is rotatably connected to the connecting hole with respect to a first axis and has a passing portion inserted into the second hole, the passing portion has a first width and a second width respectively with respect to a second axis and a third axis that are perpendicular to the first axis.

16. The housing assembly of claim 15, wherein the second hole extends away from the stopping portion substantially along a fourth axis.

17. The housing assembly of claim 16, wherein the second hole has a third width with respect to the fourth axis at a place adjacent to the stopping portion and a fourth width with respect to the fourth axis at a place away from the stopping portion, the first width is less than the third width and greater than the fourth width, and the second width is less than the fourth width.

18. The housing assembly of claim 15, wherein the second axis and the third axis are substantially perpendicular to each other.

19. The housing assembly of claim 10, wherein the pressing portion has a through passage, and the fixing member is slidably connected to the through passage.

* * * * *